United States Patent
Freuler et al.

(10) Patent No.: US 6,869,642 B2
(45) Date of Patent: Mar. 22, 2005

(54) PHASE CHANGE THERMAL INTERFACE COMPOSITION HAVING INDUCED BONDING PROPERTY

(76) Inventors: Raymond G. Freuler, 28565 Cordova, Laguna Hills, CA (US) 92653; Gary E. Flynn, 6 Calle de Princesa, Cota de Caza, CA (US) 92679; Robert A. Rauch, 21621 Fernleaf Dr., Lake Forest, CA (US) 29630

( * ) Notice: Subject to any disclaimer, the term of this patent is extended or adjusted under 35 U.S.C. 154(b) by 746 days.

(21) Appl. No.: 09/834,158

(22) Filed: Apr. 12, 2001

(65) Prior Publication Data

US 2004/0265495 A1 Dec. 30, 2004

Related U.S. Application Data

(63) Continuation of application No. 09/573,508, filed on May 18, 2000.

(51) Int. Cl.$^7$ .............................................. B05D 3/02
(52) U.S. Cl. ..................... 427/384; 252/74; 252/71; 252/73; 427/385.5; 427/386; 427/355; 427/371; 156/326
(58) Field of Search ............................. 427/385.5, 384, 427/386, 355, 371; 156/326; 252/71, 73, 74

(56) References Cited

U.S. PATENT DOCUMENTS

| | | |
|---|---|---|
| 2,799,793 A | 7/1957 | De Cain |
| 3,013,104 A | 12/1961 | Young |
| 3,249,680 A | 5/1966 | Sheets et al. |
| 3,356,828 A | 12/1967 | Furness |
| 3,391,242 A | 7/1968 | Sudges |
| 3,463,140 A | 8/1969 | Roller, Jr. |
| 3,463,161 A | 8/1969 | Andrassy |
| 3,467,547 A | 8/1969 | Harvey et al. |
| 3,476,177 A | 11/1969 | Potzl |
| 3,586,102 A | 6/1971 | Gilles |
| 3,819,530 A | 6/1974 | Ratledge et al. |
| 3,823,089 A | 7/1974 | Ryan et al. |
| 3,887,628 A | 6/1975 | Beckers |
| 3,972,821 A | 8/1976 | Weidenbenner et al. |
| 4,065,908 A | 1/1978 | Mueller |
| 4,139,051 A | 2/1979 | Jones et al. |
| 4,151,547 A | 4/1979 | Rhoades et al. |
| 4,237,086 A | 12/1980 | Gehle |
| 4,266,267 A | 5/1981 | Ruegg |
| 4,299,715 A | 11/1981 | Whitfield et al. |
| 4,466,483 A | 8/1984 | Whitfield et al. |
| 4,473,113 A | 9/1984 | Whitfield et al. |
| 4,489,487 A | 12/1984 | Bura |
| 5,060,114 A | 10/1991 | Feinberg et al. |
| 5,237,086 A | 8/1993 | Kruger et al. |
| 5,904,796 A | 5/1999 | Freuler et al. |
| 5,912,805 A | 6/1999 | Freuker et al. |
| 5,931,831 A | 8/1999 | Linder |
| 5,986,884 A | 11/1999 | Jairazbhoy et al. |

Primary Examiner—Charles Boyer
(74) Attorney, Agent, or Firm—Stetina Brunda Garred & Brucker

(57) ABSTRACT

An improved, more durable heat conductive composition for transferring heat from a heat-dissipating component to a heat dissipater and method of producing the same. The composition preferably comprises a base consisting of paraffin and, optionally, paraffin and petrolatun having electrically-conductive particles suspended therein, which preferably include graphite diamond, or elemental metals such as silver. In the preferred embodiment, the composition further includes a resin polymer to increase durability. The composition is formulated to be solid in the range of normal room temperatures, but liquify once subjected to temperatures just below the range at which heat generating electronic semi conductor devices typically operate. The present invention further comprises processes for packaging the compositions of the present invention, as well as applying the heat conductive composition to an interface between a heat-dissipating component and a heat sink.

30 Claims, 2 Drawing Sheets

PHASE CHANGE THERMAL INTERFACE COMPOSITION HAVING INDUCED BONDING PROPERTY

CROSS-REFERENCE TO RELATED APPLICATIONS

Continuation of U.S. patent application Ser. No.: 09/573,508 filed on May 18, 2000 entitled: GRAPHITIC ALLOTROPE INTERFACE COMPOSITION AND METHOD OF FABRICATING THE SAME

BACKGROUND OF THE INVENTION

Methods and materials for transferring beat at the interface between a heat-dissipating component, which typically includes various electronic components in semi-conductor devices, to an external heat dissipator or heat sink are well-known in the art. In this regard, the electronic components generate substantial heat which can cause the component to fail catastrophically. Even to the extent the component does not fail, such elevated temperatures can and frequently do affect the component's electrical characteristics and can cause intermittent or permanent changes. Indeed, the life of an electronic component is directly related to its operating temperature, and a temperature rise of so much as 10° C. can reduce the component's life by 50%. On the other hand, a corresponding decrease in 10° C. can increase a component's life by 100%.

According to contemporary methodology, the typical solution to such heat dissipation problems is to provide an external heat dissipater or heat sink coupled to the electronic device. Such heat sink ideally provides a heat-conductive pathway from the heat dissipating component to structures such as fins or other protuberances having sufficient surface area to dissipate the heat into the surrounding air. To facilitate such heat dissipation, a fan is frequently utilized to provide adequate air circulation over the fins or protuberances.

However, essential to any effective system for removing heat from an electronic component to a heat sink requires efficient and uniform heat transfer at the interface between the component and the heat sink. Among the more efficient means by which heat is transferred across the interface between the component and the heat sink has been the use of heat conductive pads. Such heat conductive pads are typically pre-formed to have a shape or footprint compatible with a particular electronic component and/or heat sink, such that a given pad may be easily applied thereto prior to coupling the heat sink to the electronic component.

Exemplary of such contemporary phase change pad-type thermal interface products are THERMSTRATE; ISOSTRATE and POWERSTATE (each registered trademarks of Power Devices, Inc. of Laguna Hills, Calif.). The THERMSTRATE interface comprises thermally conductive, die-cut pads which are placed intermediate the electronic component and the heat sink so as to enhance heat conduction there between. The THERMSTRATE heat pads comprise a durable-type 1100 or 1145 aluminum alloy substrate having a thickness of approximately 0.002 inch (although other aluminum and/or copper foil thickness may be utilized) that is coated on both sides thereof with a proprietary thermal compound, the latter comprising a paraffin base containing additives which enhance thermal conductivity, as well as control its responsiveness to heat and pressure. Such compound advantageously undergoes a selective phase change insofar as the compound is dry at room temperature, yet liquefies just below the operating temperature of the great majority of electronic components, which is typically around 50° C. or higher, so as to assure desired heat conduction. When the electronic component is no longer in use (i.e., is no longer dissipating heat), such thermally conductive compound resolidifies once the same cools to room temperature.

The ISOSTRATE thermal interface is likewise a die-cut mounting pad and utilizes a heat conducting polyamide substrate, namely, KAPTON (a registered trademark of DuPont) type MT. The ISOSTRATE thermal interface likewise is a proprietary paraffin-based thermal compound utilizing additives to enhance thermal conductivity and to control its response to heat and pressure.

The process for forming thermal interfaces according to contemporary methodology is described in more detail in U.S. Pat. No. 4,299,715, issued on Nov. 10, 1981 to Whitfield et al. and entitled a METHODS AND MATERIALS FOR CONDUCTING HEAT FROM ELECTRONIC COMPONENTS AND THE LIKE; U.S. Pat. No. 4,466,483, issued on Aug. 21, 1984 to Whitfield et al. and entitled METHODS AND MEANS FOR CONDUCTING HEAT FROM ELECTRONIC COMPONENTS AND THE LIKE; and U.S. Pat. No. 4,473,113, issued on Sep. 25, 1984 to Whitfield et al., and entitled METHODS AND MATERIALS FOR CONDUCTING HEAT FROM ELECTRONIC COMPONENTS AND THE LIKE, the contents of all three of which are expressly incorporated herein by reference.

As is well-known in the art, by providing a thermally conductive compound that is formulated to have selective phase change properties (i.e., having a melting point such that the compound is solid at room temperature, but liquefies at or below the operating temperature of the electronic component to which it is coupled) advantageously enables the compound to be easily used and handled when applied to the interface between the component and a given heat sink. On the other hand, by assuming a liquid state when exposed to the operating temperature of the electronic component, such thermally conductive composition advantageously is then able to fill the voids created by air gaps at the interface between the electronic component and the heat sink. Once filled, such gaps no longer impose an impediment to efficient heat transfer. As those skilled in the art will appreciate, heat flow across the interface improves substantially with better mechanical contact between the electronic component and the heat sink.

Despite their general effectiveness at transferring heat, however, many thermally conductive compounds currently in use have the drawback of being difficult to package, ship, and apply. In this regard, phase change thermal interface materials tend to be very sensitive and can be easily ablated when handled during manufacturing and shipping processes. Moreover, such compounds are typically difficult to accurately apply into position due to the lack of adhesiveness inherent in such compounds, which in turn causes migration or shifting from the interface surface upon which they are applied. Specifically, due to the generally wax-like nature of such thermal interface materials, such materials are inherently susceptible to deformation and mis-shaping even when subjected to minimal handling or use. As a consequence, such thermal compounds, once ablated or mis-shapen, become substantially compromised as to their ability to transfer heat across an interface. Specifically, such deformation can cause air gaps or voids to form at the thermal interface, which, as a heat conductive medium, is inefficient.

As such, as opposed to being deployed at the time of manufacture, as would be optimal to minimize expense and expedite manufacturing, such materials must be applied at a later time, typically on-site by the end user. Such processes are well-known in the art to not only be labor intensive, but also messy and difficult to handle. The latter factor is exceptionally problematic insofar as the same often results in an excessive loss of product, particularly with respect to thermal grease and other prior art compositions.

To address such shortcomings, attempts have been made to provide thermally-conductive materials formed as freestanding, self-supporting layers which may be formed as sheet-like materials, such as films or tapes, that can be readily interposed between the heat-generating component and heat sink. An example of such a material is disclosed in U.S. Pat. No. 6,054,198, issued on Apr. 25, 2000, to Bunyan et al. entitled "Conformal Thermal Interface Material for Electronic Components." The interfaces that are the subject of such patent consists essentially of at least one resin or wax component blended with at least one thermally-conductive filler, the latter of which preferably comprises an electrically-nonconductive filler which exhibits a thermal conductivity of about 25 to 50 W/m-° K. In an alternative preferred embodiment, the compound utilizes the combination of a pressure sensitive adhesive and an alpha-olefinic thermal plastic component, along with the electrically-nonconductive filler.

In use, such materials are operative to remain form-stable at normal room temperature in a first phase but are conformable in a second phase to substantially fill the interface between the heat-generating electronic component and heat transfer mechanism. To achieve that end, such compositions are formulated to possess a transition temperature at which the material transitions from the first solid phase to the second molten or glass phase that falls within the operating temperature range of the electronic component.

Despite such advanced formulations, however, such conformal thermal interface materials have the drawback of being formulated to transition from its first solid phase to its second conformable phase at a temperature falling within the operating temperature of the electronic component (i.e., the temperature range in which the device has been designed to operate), and hence requires the generation of substantial heat before the phase change can occur. As such, the superior mechanical contact afforded by the thermally-conductive compound as it assumes its conformal or liquid phase is not attained until substantial heat has already been generated. This is disadvantageous to the extent it compromises prematurely the lifetime of the electronic device.

Another disadvantage of these materials is the chosen thermally-conductive filler which is preferably non-conducting and characteristically exhibits a thermal conductivity of about 25 to 50 W/m-° K. The use of electrically-nonconductive fillers, such as metal oxides, results in the production of a light or off-white material which, in use, becomes substantially more difficult to deploy than materials formulated to have darker shades.

Also exemplary of such thermally-conductive materials include those materials disclosed in U.S. Pat. No. 5,930,893, issued on Aug. 3, 1999, to Eaton entitled "Thermally Conductive Material and Method of Using the Same." Such material comprises a paraffinic wax, which may further include an ethylene/vinyl acetate copolymer, that is specifically formulated to have a melting temperature above the normal operating temperature of the component to which the same is applied. In application, such thermally conductive compounds are first interposed at the interface between the electronic component and heat sink. Thereafter, the component is operated at a temperature which goes beyond its normal operating temperature such that the thermally conductive compound is caused to melt. While in such liquid state, the thermally conductive compound fills the air gaps and voids present at the interface to ensure a better continuum of physical contact across the interface. The temperature applied to the interface is then reduced such that the thermally conductive compound re-solidifies, with the electronic component subsequently operating at its normal operating temperature. In light of being below the melting point of the thermally conductive compound, such subsequent operation of the component does not cause the thermally conductive compound to change phases. In this respect, once initially applied and heated such that the same liquefies and thereafter re-solidifies, such compounds do not undergo any type of phase change, but rather remain in solid phase indefinitely.

Problematic with the formulation of such materials, however, is that substantial heat must be initially introduced to the interface and must necessarily be above the operating temperature of the electronic component. Such elevated temperatures can thermally damage the electronic component, which ironically is the condition which such materials attempt to avoid. Likewise, because the thermally-conductive materials only assume a liquid phase once during application and thereafter re-solidify, to the extent any air gaps or voids are present following such re-solidification, there will thus permanently be in place an inefficient pathway for heat to flow thereacross.

Accordingly, there is a need for a thermally conductive compound that is easy to handle and apply, effective in filling the voids between and transferring heat away from a given heat-dissipating component to a heat sink and preferably is formulated to assume a selective phase change whereby the compound is in a solid state at room temperature, but liquefies when subjected to higher temperatures just below the temperatures at which electronic devices typically operate. There is further a need in the art for a thermally conductive interface compound that is of simple formulation, easy to produce, possess enhanced adhesive properties to insure accurate placement, and does not require special handling.

SUMMARY OF THE INVENTION

The present invention specifically addresses and alleviates the aforementioned deficiencies in the art. In this regard, the present invention is directed to a thermally conductive compound for facilitating the transfer of heat from a heat dissipating component to a heat sink that, in addition to effectively conducting heat, is substantially more durable and rugged than prior art compositions. Such composition is further capable of being more easily packaged, shipped and applied than prior art composition, and, in particular, possesses greater adhesion qualities than such compounds.

In the preferred embodiment, the composition comprises a base of paraffin or, optionally, a blend of paraffin and petrolatum having quantities of thermally-conductive particles, namely, graphite, diamond, silver, copper or other metallic particles, suspended therewith. The blend of paraffin and petrolatum is preferably formed such that the ratio of paraffin to petrolatum by percent weight ranges between 1.0:0 to 3.0:1. The thermally-conductive particles are preferably present in amounts between 10% by 40% by weight, with 29%–30% being most preferred. The particles, of which graphite is most preferred, are further preferably formed to have generally spherical shapes having a diameter equal to or less than 6 microns. Additional components may be added to the thermal composition of the present invention, for example, a synthetic polymer resin, to impart greater durability. Although not preferred, there may further be provided a thinning agent, such as a polyalphaolephin. Other surfactant materials are also contemplated. In all embodiments though, the composition is preferably formed to have selective phase change properties whereby the composite exists in a solid phase at normal room temperature, but melts, and therefore assumes a liquid phase, when subjected to temperatures which are just below the levels heat-dissipating electronic components usually operate (i.e., 60° C., or lower).

The present invention further comprises a process for formulating the thermally conductive compositions of the present invention, which comprises the steps of melting the paraffin (or blending the paraffin and petrolatum) to form a first admixture, followed by adding a resin polymer to increase the durability of the composition. Thereafter, a first portion of the graphite particles, which preferably comprises 60%±10% of the total final weight of graphite. Thereafter, the second remaining portion of the graphite, which preferably comprises 40%±10% of the total graphite weight, is then added, with the resultant admixture then being sufficiently mixed until the entire portion of graphite particles becomes sufficiently dispersed and suspended therewithin. Optionally, although not preferred, a viscosity-enhancing agent, which preferably comprises fumed silica, may then be added and thorough mixed therein to form the resultant composition.

Such resultant composition may then be applied to thermal interfaces as would conventional thermally conductive compounds. In this regard, the composition of the present invention may be directly excoriated upon the interface surface or may be applied to the respective interface surfaces via a conventional coating rods, whether wire wound or roll formed. Alternatively, it is contemplated that the composition may also be melted down and dispensed upon the interface surfaces between a heat-dissipating component and a heat sink and/or applied by way of screen printing techniques to the heat sink or component.

In yet another aspect of the present invention, there is provided a method for forming, shipping and applying the composition of the present invention. According to a preferred embodiment, the composition is formed as a film that is deposited upon a substrate, which may comprise a sheet of polyester or silicone-coated paper. The compositions are formed as films to a desired thickness, as may be necessary for a desired application. Once so applied to the substrate, the film may be cut preferably by way of die cutting to desired shapes and dimensions such that the same may be readily removed or peeled away from the substrate and placed into position at the desired interface. In this respect, the film may be pre-cut as may be suited for a specific application.

With regard to certain novel approaches for applying the compositions of the present invention, it is further contemplated that such compositions may be secured into position at the desired interface mating surfaces with greater adhesion thereto. To that end, there is provided methods for securing the interface compositions into position by selectively preparing such interface surfaces prior to application of such compound. According to a first preferred methodology, such mating surfaces are pre-heated, preferably between 40° to 50° C., prior to the application of such composition to the interface mating surfaces. When so heated, the composition is applied as desired to either the heat sink on the electronic component wherein upon assembly of the heat sink and component the composition is sandwiched therebetween. As an alternative methodology, such composition may be applied by initially applying a solvent to such interface mating surfaces including, among other things, surfactant materials which are operative to soften the thermally-conductive compositions and cause the same to adhere in a precise position. Lastly, it is contemplated that such compositions may be applied by merely applying pressure to such compounds such that the same adhere and become bonded to the desired interface mating surface.

The present invention thus provides a thermally conductive interface composition that is substantially more rugged and durable than prior art compositions, and may be further formulated to be more easily packaged, shipped, and applied than such compositions.

The present invention further provides a thermally conductive interface composition that can withstand abuse in shipment and handling that is likewise exceptionally effective in conducting heat from a heat-dissipating component, such as an electronic element, to a heat sink to thus increase the reliability and life of the component.

The present invention further provides a thermally conductive interface composition that can be readily deployed in remote manufacturing processes, as opposed to prior art compositions requiring post-shipment, on-site application.

The present invention further provides a thermally conductive interface composition that is capable of providing a highly efficient heat transfer medium, which offers economic advantages for options of eliminating costly heat-dispensing mechanism, such as fans, or toward reduction in the size, weight, and cost of heat sinks.

The present invention further provides a thermally conductive interface composition that is clean and easy to use, possesses greater bonding properties, and further, may be used in solid form, or which is in solid form when used, but which will become fluid when performing its function at elevated temperatures.

The present invention still further provides a thermally conductive interface composition that is of simple formulation and may be readily made from commercially available materials.

Still further object of the present invention are to provide a process for forming the novel thermally conductive interface composition of the present invention, packaging such composition, and applying the same to the interface between a heat-dissipating component and a heat sink.

BRIEF DESCRIPTION OF THE DRAWINGS

These, as well as other features of the present invention, will become more apparent upon reference to the drawings, wherein.

DETAILED DESCRIPTION OF THE INVENTION

Figure 1:
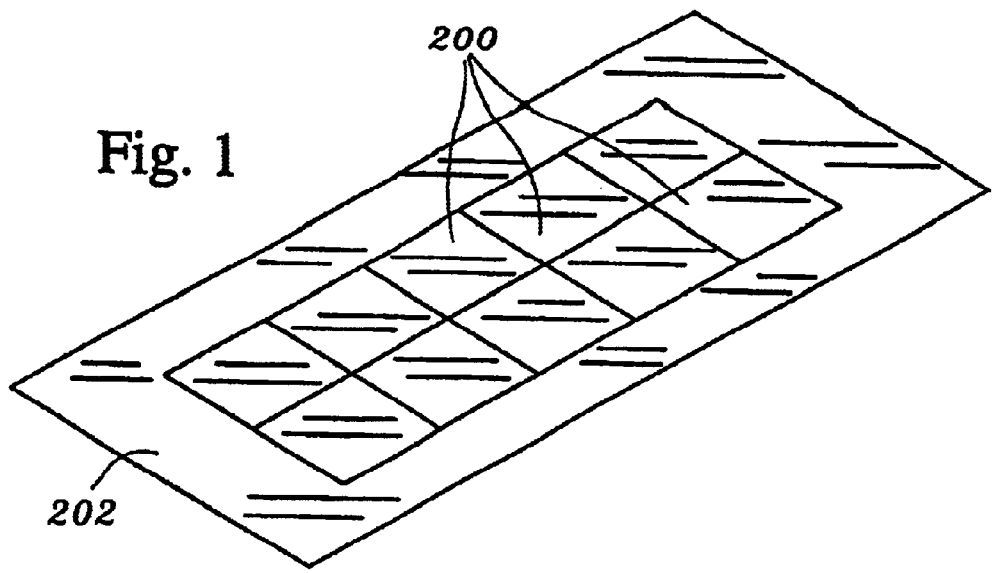
FIG. 1 perspectively illustrates a film of heat conductive compound formulated according to a preferred embodiment of the present invention as deposited as a film upon a substrate.

The detailed description set forth below in connection with the appended drawings is intended merely as a description of the invention, and is not intended to represent the only form in which the present invention may be constructed or utilized. The description sets forth the functions and sequence of steps for construction and implementation of the invention in connection with the illustrated embodiments. It is to be understood, however, that the same or equivalent functions and sequences may be accomplished by different embodiments that are also intended to be encompassed within the spirit and scope of the invention.

The composition of the present invention comprises a durable wax-like, thermally conductive interface compound whose purpose is to complete a thermally conductive path from a heated element to a heat sink, that is exceptionally more durable, and possess better re-flow properties than prior art compositions. In this regard, the use of heat conducting materials to transfer heat from a heated element, such as a semiconductor or other electronic components, to a heat dissipater or heat sink is well known in the art, and is necessary insofar as such heated element requires that the heat given off by such component be drawn away therefrom. Otherwise, substantial, if not permanent damage, can be experienced by the electronic component via the phenomenon known in the art as thermal fatigue or thermal fatigue or thermal runaway.

While thermally conductive interface compositions of the prior art are effective at transferring heat away from the heat dissipating component to a heat sink coupled therewith, virtually all prior art compositions have the drawback of being easily deformed or misshapen once applied to an interface. In this regard, such prior art compositions, which are typically formed from grease or wax-like materials, can ablate or scar when subjected to minimal contact. Such materials can further become deformed when subjected to elevated temperatures. Such deformation is especially likely during shipment where vigorous handling frequently occurs, as well as through extreme environmental temperature fluctuations.

The thermally conductive interface compounds of the present invention, by contrast, are specifically designed and formulated to have substantially greater durability than such prior art compounds. Such properties enable such novel compounds to be utilized in remote manufacturing processes of electronic components which can then be shipped without incurring substantial added labor costs.

The basic two (2) components that comprise this invention, and the respective percentages, by weight thereof, encompass the following ranges:

TABLE 1

| COMPONENTS | PERCENT BY WEIGHT |
| --- | --- |
| Paraffin | 60% to 90% |
| Graphite | 10% to 40% |

The graphite component preferably comprises high grade commercial graphite powder. The graphite exists as particles preferably comprises spherical particles having a diameter ranging typically less than 6 microns. Additionally, in a more highly preferred embodiment, the graphite component is present in amount of approximately 29%–30% by weight, with 29.5% being most preferred. Among the types of commercially available graphite powder suitable for practice of the present invention include KS-6, produced by Timcal America, Inc. of Westlake, Ohio.

The paraffin component of the composition of the present invention may be of standard commercial grade for use in a wide range of commercial applications. Preferably, the paraffin component comprises 51° C. or 60° C. paraffin wax which, as will be known to those skilled in the art, constitutes a grade of paraffin having a specific melting point (i.e., 51° C./60° C.). By utilizing 51° C./60° C. paraffin wax, the resulting composition which will thus correspond to the temperature at which the composition transitions from its solid phase to its molten, liquid phase. However, those skilled in the art will recognize that such temperature can be modified as desired for particular applications.

Advantageously, such melting point is selected to be below the temperature at which most electronic components operate. In this regard, such thermal composition will only assume the liquid state during the operation of the electronic component, and only during such time as the component operates at such elevated temperatures. As a result, interface surface wetting action is achieved and heat transfer efficiency for the component is enhanced for the life of the component across its full operating temperature range.

Although the compositions of the present invention preferably utilize paraffin exclusively as the base compound, petrolatum may additionally be blended with the paraffin to thus form a resultant base compound having a desired hardness or softness, as may be advantageous for a given application. Preferably, the paraffin and petrolatum components will be blended together such that the ratio of such components (i.e., paraffin to petrolatum) is between approximately 1.0:0 to 3.0:1 by percent weight, with the petrolatum being present at a maximum of 22.5% by weight. In this regard, as the petrolatun component is increased relative to the paraffin component, the resultant composition will correspondingly be caused to increase in softness. Moreover, increasing the petrolatum component may increase adhesiveness or bonding property of such composition to thus facilitate the ability of such composition to be accurately and securely placed into position between the mating surfaces of an electronic component and heat sink coupled therewith, as discussed more fully below.

In order to impart greater durability and ruggedness to the composition, as is typically desired when taking into account manufacturing and shipping considerations for electronic devices, there may be added to the composition a plastic, or polymer material, and preferably a synthetic resinous plastic material such as ethylene-vinyl acetate copolymer, a commercially available example of which is ELVAX®, a registered trademark of E.I. DU PONT DE NEMOURS & COMPANY of Wilmington, Del. Such synthetic resinous material may be present in an amount of up to 5% of the weight of the final composition. According to more highly preferred embodiment, such resinous material may be present in an amount of approximately 3.0–3/5% by weight, with 3.3% being most preferred. In such embodiments, the paraffin component will correspondingly be present in an amount of 67–68% by weight, and present in an amount of 67.2% by weight according to the most highly preferred embodiment.

As will be appreciated, in any formulation the compositions of the present invention will have the desired phase change property of remaining in a solid phase while in the range of normal room temperature, and as the temperature rises become plastic, and thereafter become molten at higher temperatures, as will be encountered by the composition when applied to the interface between the heat-dissipating component and a heat sink. In this respect, by assuming a liquid state during operation of the electric component, the thermally conductive composition of the present invention will be able to fill those voids or air gaps existing at the interface between the component and the heat sink and will thus provide for better contact, and thus better heat conduction versus the condition of poor heat conduction if such voids or gaps were not otherwise filled. It will additionally be recognized, however, that although paraffin, and to a lesser extent a mixture of paraffin and petrolatum, are discussed as preferred components of the composition of the present invention, numerous other natural or synthetic materials may also be utilized. Representative of such suitable materials include, but are by no means limited to, beeswax, palm wax, micro crystalline waxes, mineral waxes, and/or glycerin, either alone or in combination. It should further be recognized that certain vegetable oils may also serve as a component of the thermally conductive composition of the present invention.

Likewise, with respect to the thermally-conductive filler, although graphite is a preferred material based upon its high thermal conductivity and low cost, alternative materials may also be utilized. In this regard, in addition to graphite, it is contemplated that diamond or elemental metals, and in particular silver and copper may be utilized. In all embodiments, however, such filler should be electrically conductive and possess a thermal conductivity above 100 W/m° –K, and preferably above 150 W/m° –K. In this regard, while electrical insulation is often preferred, due to the fact that the electronic components and heat sink coupled therewith are already electrically insulated, there appears to be no sound reason why the use of conductive fillers which have substantially higher conductivities have not been deployed.

Figure 3:
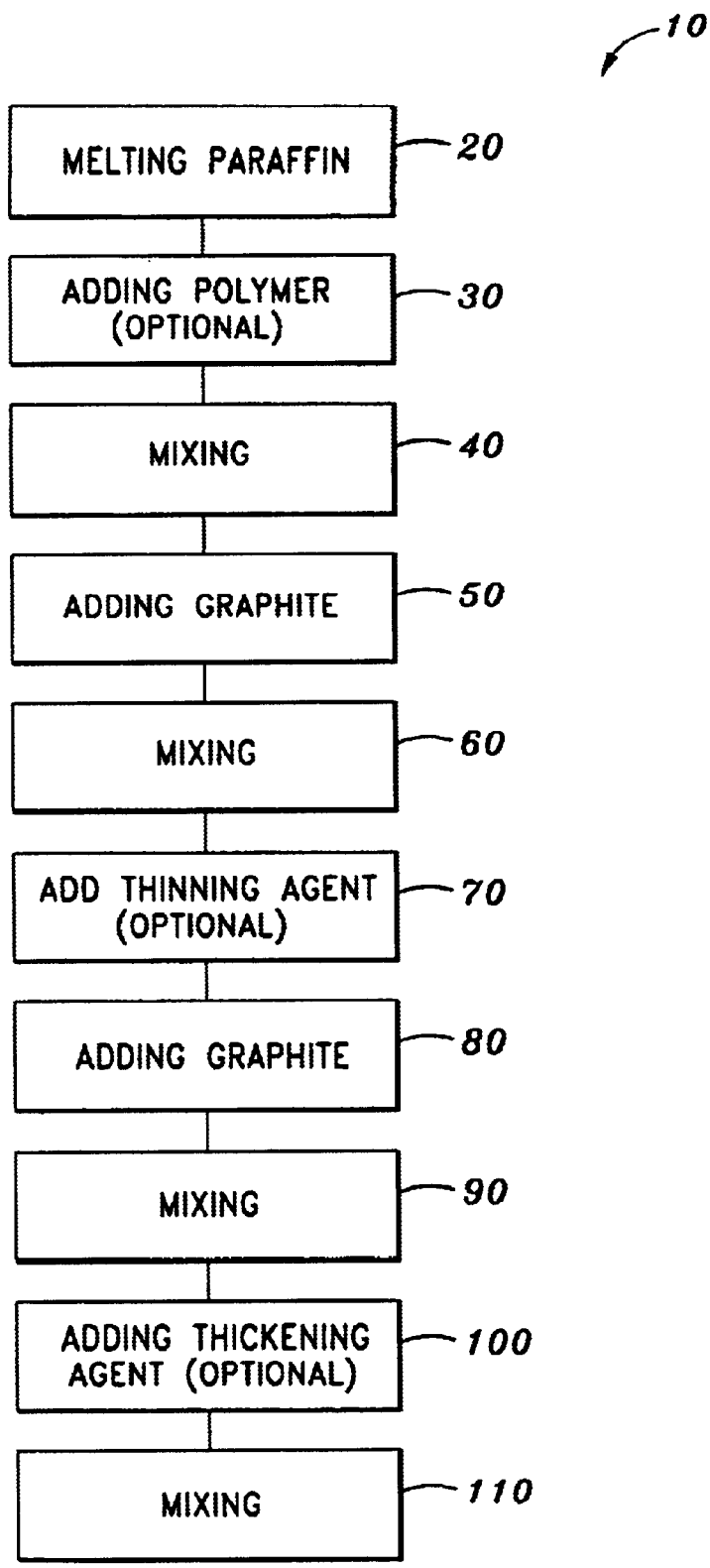
FIG. 3 schematically depicts the steps utilized in producing the heat conductive compound according to a preferred process of the present invention.

With respect to the aforementioned composition, the same may be prepared according to the schematic flow diagram of FIG. 3. The process 10 of formulating the compositions of the present invention comprises the initial step 20 of adding the paraffin and petrolatum components in a ratio of between approximately 1.0:0 to 3.0:1 by percent weight and melting the same until a first admixture of blended paraffin and petrolatum is formed. As desired to increase the durability and ruggedness of the composition, in step 30 there is added the polymer material, which preferably comprises a resin, such as ELVAX®, as discussed above, in an amount sufficient such that the resin component will be present in an amount of up to 5% by weight of the final composition. Such material is in blended with the first admixture to form a second admixture.

Following mixing step 40, a first portion of the conductive material, preferably graphite, which preferably comprises 60%±10% of the total weight of graphite to be added to the composition, is added in a fourth step 50, and thereafter thoroughly mixed in step 60 to thus form a third admixture. As it will appreciated, the thermal compound for the present invention will achieve optimal migration resistant properties when the particles of graphite are as thoroughly dispersed within the paraffin/petrolatum base as possible such that the surface area thereof is maximized.

The thinning agent, which preferably comprises a polyalphaolephin, such as Vybar 103 produced by Baker Petrolite, may then be optionally added to the composition in step 70 and then thoroughly mixed therein to thus produce a fourth admixture. As will be appreciated by those skilled in the art, the thinning agent facilitates the ability of the particulate graphite to be thoroughly mixed i.e., wetted within the paraffin/petrolatum base of the thermal compound of the present invention. The addition of up to 2% by weight of Vybar 103 is considered optimal in the practice of the present invention insofar as the same correspondingly allows the solid contents to be easily incorporated into the paraffin/petrolatum base of the present invention. While Vybar 103 is a particularly well-suited thinning agent for practice of the present invention, particularly in light of its being a highly branched polyalphaolephin, it will be recognized by those skilled in the art that other thinning agents, or surfactant materials agents, or surfactant materials may be utilized in the practice of the present invention.

Once such fourth admixture is attained, the remaining portion of graphite, which preferably comprises the remaining 40%±10% of the total graphite weight, is then added in step 80 and thoroughly mixed therein via step 90 to thus produce a resultant fifth admixture. While it is contemplated that all of the graphite may be added to the second admixture, due to the substantial viscosity that is immediately produced upon introduction of the entire amount of graphite, coupled with the substantial increase in mixing time necessary to thoroughly disperse such graphite particles throughout the admixture, it is presently believed that a multi-step introduction of the graphite is preferred.

The resultant fifth admixture suitable for use as a thermally conductive compound for transferring heat from a heat-dissipating component to a heat sink. Notwithstanding, and although not preferred, a thickening composition may optionally be added in step 100 and mixed therein in step 110 to increase the sag resistance of the thermal composition to thus impart viscosity build-up and flow control properties that may be desired for a given application. One preferred agent includes fumed silica, and in particular Cab-O-Sil M5 produced by Cabot Corporation, Inc. of Boston, Mass., which may be preferably added to the composition in an amount up to approximately 5.0% by weight of the total composition to achieve a sufficiently high degree of sag resistance for most interface applications. Preferably, the thermal compositions of the present invention will be formulated such that the same have a viscosity of 42 SUS, which corresponds to the Sibilate Universal Scale viscosity index commonly utilized in the United States.

Figure 2:
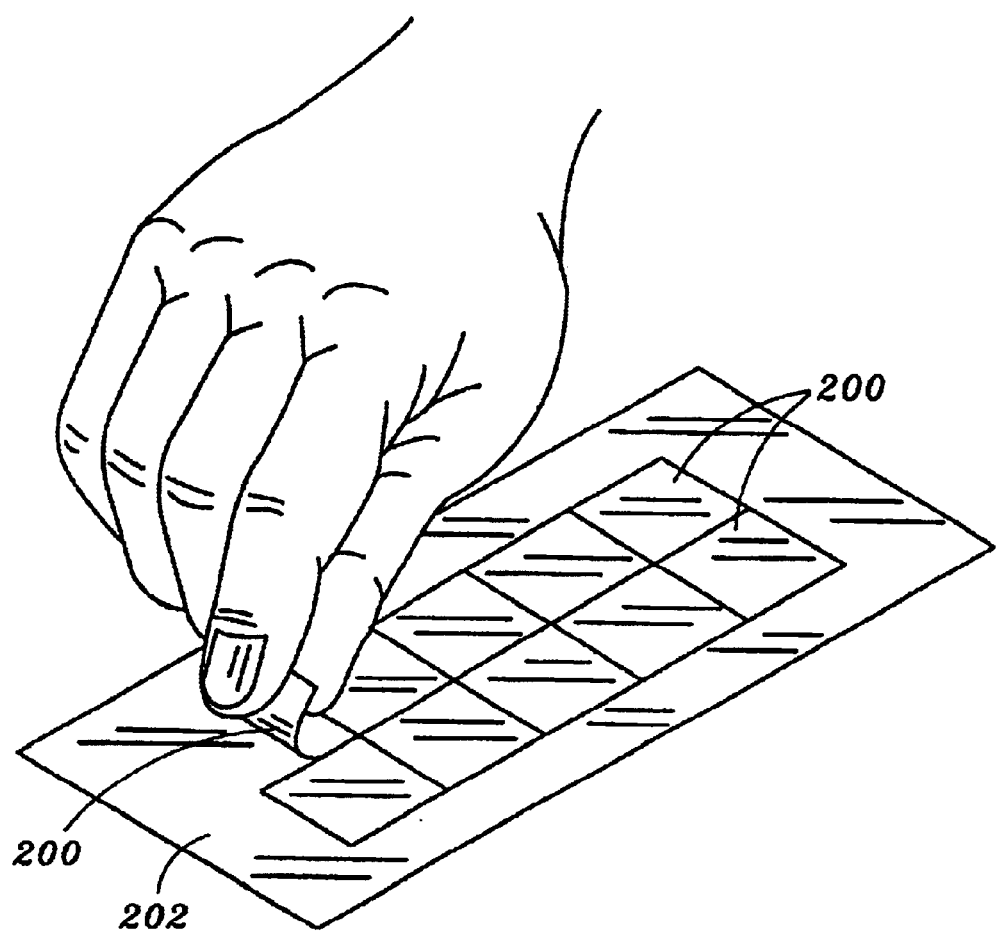
FIG. 2 is a perspective view of the film of heat conductive compound as deposited on the substrate shown in FIG. 1 with such film having been cut to pre-determine dimensions, a portion of being peeled from said substrate by hand or by more efficient mechanical methods.

In a novel approach to facilitate the packaging and shipping of the thermal compositions of the present invention, there is illustrated in FIGS. 1 and 2 a preferred embodiment by which the thermally conductive compositions may be formed as films and cut to specified dimensions for quick and accurate application to a given interface. As illustrated, the thermally conductive compositions are formed as a film 200 upon a substrate 202. Preferably, such thermally conductive compositions are formed to a thickness of 0.5 to 3 mil upon such substrate 202, the latter of which preferably comprising a polyester release substrate or silicone-coated substrate, Advantageously, due to the enhanced durability and ruggedness of the compositions of the present invention, the same are capable of being applied to such substrate 202 and thereafter shipped to a desired location without becoming misshaped or otherwise deformed. As will be recognized by those skilled in the art, most very thin thermally conductive compounds are not durable enough to be formed as films, let alone capable of being shipped as such.

Advantageously, due to its capability of being shipped in such film form, the thermally conductive compounds of the present invention are thus formed in a state that the same may be readily applied to a given interface with minimal amounts of time, effort and labor. Of additional advantage is the fact that the compositions of the present application, especially when formulated to include graphite as a thermally-conductive particulate suspended within the composition, such compositions will have a blackish or dark hue which will provide the person applying the same with a greater visual accuracy as to the placement of such compositions. As is well-known, clear or whitish semi-conductive materials, such as those which include metal oxides such as zinc oxide and aluminum oxide, are difficult to visually ascertain as to whether or not the same has been sufficiently applied to a given interface. At the same time, such lighter color can cause the user to deposit an excess of such material, which causes for a thicker interface and hence less efficient heat flow.

To further facilitate the ability of such compositions to be more rapidly applied to a desired interface, the film 200 formed upon the substrate 202 may be pre-cut to desired dimensions, as depicted in FIG. 2. In this respect, the film 200 may be cut such that a multiplicity of film segments are formed as shown which may each be removed from the substrate and selectively positioned at a desired interface. Advantageously, the thermally conductive compositions of the present invention are formulated to easily peel away from such substrate, such as by rolling the substrate over a conventional dispense mechanism or as schematically illustrated in FIG. 2.

In addition to the foregoing, there is likewise provided herein novel ways of applying the thermally conductive compositions to a given interface surface. According to a first preferred methodology, such process includes preheating the heat sink to which the composition is to be applied to a temperature less than 51° C., and preferably between 40° to 50° C. When so heated, the composition may be applied to the desired location upon the heat sink. Preferably, the heat sink with thermally conductive composition applied thereto is allowed to cool before affixing the electronic component. Advantageously, it is been shown that heating such heat sink to such elevated temperature facilitates the ability of the thermally conductive compounds of the present invention to possess greater adhesiveness or bonding capability and remain at the desired location with greater strength than if not otherwise heated.

In another preferred methodology, it is contemplated that a solvent, which preferably includes a surfactant, is applied to one or both of the interface mating surfaces with the thermally conductive composition thereafter applied thereto. Advantageously, the solvent causes the composition to soften and more readily adhere to the desired interface mating surface i.e., either pressed upon the heat sink or the electrical component. In a final preferred methodology, it is contemplated that the composition may be placed into position by applying a pressure to such composition when the same is positioned at the desired interface mating surface. In this regard, with respect to the film of thermally conductive composition, as provided for in FIGS. 1 and 2, it is believed that merely applying a pressure to the substrate on the opposed side of the film may cause the composition to readily release therefrom and remain securely applied to the interface mating surface. As discussed above, in order to increase the ability of the thermally conductive compositions to more securely remain at the interface mating surface to which the same are applied, it is believed that increasing the petrolatum component of such composition will facilitate that end. As discussed above, it is contemplated that increasing the petrolatum component relative the paraffin component will provide the desired adhesive properties to facilitate that ability of the thermally conductive compositions to more securely adhere to the interface mating surfaces.

The thermally conductive compositions of the present invention may alternatively be applied to a given interface surface via conventional coating rods. Such coating rods, known in the art as "metering rods" or "wet film applicator rods" are particularly effective in producing coatings having uniform thicknesses about the surfaces to which they are applied. Alternatively, it is contemplated that the composition of the present invention may be melted and thereafter be possibly sprayed, or screen printed directly or dispensed onto the surfaces to be interfaced with one another. As will be appreciated by those skilled in the art, in order to so apply the compositions of the present invention, such receiving surfaces typically must be heated to a temperature close to or above the temperature at which the composition transitions to its liquid phase. The composition may also be directly applied onto interface pads, and the like. For most applications, it has been found that a single coating having a thickness of 0.5 to 3 mil will exhibit excellent thermally conductive properties that further show no migration down vertically-oriented thermal interfaces at temperatures of 100° C.

Once so applied, the composition of the present invention will perform in a manner substantially similar to, or more effective than, prior art thermally conductive compositions. In this regard, the composition of the present invention will remain solid at normal room temperatures, but assume a liquid phase when heated to temperatures at or over 51° C., which is typically just below of the temperatures at which electronic components operate. The composition of the present invention has been shown to increase the reliability and life of the electronic components from 50% to 100% for every 5° to 10° C. decrease in the operating temperature of such given electronic components. This feature advantageously translates directly into providing optimal electronic component operation. Moreover, the greater efficiency by which heat is transferred via the composition of the present invention enables costs to be minimized with respect to heat dissipating componentry. In this regard, by providing a highly efficient heat transfer medium, there can be elimination of costly fans, or alternatively, reduction in the size, weight and cost of heat sinks necessary to effectively dissipate heat generated from the electronic componentry.

Advantageously, however, the composition of the present invention will further resist migration away from the interface surfaces to which it is applied. Moreover, such compositions, when formulated in the aforementioned manner, are very durable and have a hard finish in the solid phase. Such properties are desirable insofar as such durable hard finish allows the coated substrates to be handled and processed into shapes with very low product loss due to deformation or marring of the surface coating.

Although the invention has been described herein with specific reference to a presently preferred embodiment thereof, it will be appreciated by those skilled in the art that various additions, modifications, deletions, and alterations may be made to such preferred embodiment without departing from the spirit and scope of the invention. Accordingly, it is intended that all reasonably foreseeable additions, modifications, deletions, and alterations be included within the scope of the invention as defined in the following claims.

What is claimed is:

1. A method of packaging a heat conductive composition for transferring heat from a heat-dissipating component to a heat-dissipater comprising the steps:

(a) providing a heat conductive composition comprised of:
  (i) 60% to 90% by weight of paraffin;
  (ii) 0% to 5% by weight of resin; and
  (iii) 10% to 40% by weight of graphite;
(b) providing a planner substrate; and
(c) forming a film of the heat conductive composition provided in step (a) upon the substrate of step (b).

2. The method of claim 1 wherein in step (c), said film of said heat conductive composition is applied to the substrate to a thickness of 3 mil or less.

3. The method of claim 2 wherein said heat conductive composition is applied to a thickness of 0.5 to 3 mil.

4. The method of claim 1 further comprising the step:
(d) cutting the film formed upon the substrate to a particular shape.

5. The method of claim 1 wherein in step (a), said heat conductive composition further comprises petrolatum.

6. The method of claim 5 wherein said petrolatum is present in an amount no greater than about 22.5% by weight of said composition.

7. A method of applying a heat conductive composition to a heat sink comprising the steps:
(a) providing a heat-conductive composition comprised of:
  (i) 60% to 90% by weight of paraffin;
  (ii) 0% to 5% by weight of resin; and
  (iii) 10% to 40% by weight of graphite;
(b) heating the surface of said heat sink; and
(c) applying the heat conductive composition in step (a) to the heated heat sink in step (b).

8. The method of claim 7 wherein in step b, said heat sink is heated to a temperature not to exceed 51° C.

9. The method of claim 8 wherein said heat sink is heated to a temperature between 40° to 50°.

10. The method of claim 7 wherein in step a, said heat conductive composition further comprises:
(d) petrolatum.

11. The method of claim 9 wherein said petrolatum is present in an amount no greater than about 22.5% by weight of said composition.

12. A method of applying a heat conductive composition to a heat sink comprising the steps:
(a) providing a heat-conductive composition comprised of:
  (i) 60% to 90% by weight of paraffin;
  (ii) 0% to 5% by weight of resin; and
  (iii) 10% to 40% by weight of graphite;
(b) applying a solvent to an interface mating surface formed on the heat sink; and
(c) applying the heat conductive composition in step (a) to the interface mating surface in step (b).

13. The method of claim 12 wherein in step (a) said composition further comprises
(d) petrolatum.

14. The method of claim 13 wherein said petrolatum is present in an amount no greater than about 22.5% by weight of said composition.

15. A method of applying a heat conductive composition to a heat sink comprising the steps:
(a) providing a heat conductive composition comprised of:
  (i) 60% to 90% by weight of paraffin;
  (ii) 0% to 5% by weight of resin; and
  (iii) 10% to 40% by weight of graphite; and
(b) compressing said composition in step (a) onto an interface mating surface formed upon said heat sink.

16. The method of claim 15 wherein in step (a) said composition comprises (d) petrolatum.

17. The method of claim 16 wherein said petrolatum is present in an amount no greater than about 22.5% by weight of said composition.

18. The method of claim 1 wherein in step (b), said planner substrate is selected from the group consisting of a polyester release substrate and silicone-treated paper.

19. The method of claim 1 wherein said paraffin comprises 50° C. paraffin wax.

20. The method of claim 1 wherein said paraffin comprises 60° C. paraffin wax.

21. The method of claim 1 wherein said resin comprises an ethylene vinyl acetate copolymer.

22. The method of claim 7 wherein said paraffin comprises 50° C. paraffin wax.

23. The method of claim 7 wherein said paraffin comprises 60° C. paraffin wax.

24. The method of claim 7 wherein said resin comprises an ethylene vinyl acetate copolymer.

25. The method of claim 12 wherein said paraffin comprises 50° C. paraffin wax.

26. The method of claim 12 wherein said paraffin comprises 60° C. paraffin wax.

27. The method of claim 12 wherein said resin comprises an ethylene vinyl acetate copolymer.

28. The method of claim 15 wherein said paraffin comprises 50° C. paraffin wax.

29. The method of claim 15 wherein said paraffin comprises 60° C. paraffin wax.

30. The method of claim 15 wherein said resin comprises an ethylene vinyl acetate copolymer.

* * * * *